US007972932B2

United States Patent
Sato et al.

(10) Patent No.: US 7,972,932 B2
(45) Date of Patent: Jul. 5, 2011

(54) MARK FORMING METHOD AND METHOD FOR MANUFACTURING SEMICONDUCTOR DEVICE

(75) Inventors: Takashi Sato, Kanagawa (JP); Hiroko Nakamura, Kanagawa (JP); Masaru Suzuki, Kanagawa (JP); Ryoichi Inanami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 312 days.

(21) Appl. No.: 12/407,814

(22) Filed: Mar. 20, 2009

(65) Prior Publication Data

US 2009/0246891 A1    Oct. 1, 2009

(30) Foreign Application Priority Data

Mar. 25, 2008  (JP) .................................. 2008-078580

(51) Int. Cl.
 *H01L 21/76* (2006.01)
(52) U.S. Cl. .......... 438/401; 257/E21.529; 257/E23.179
(58) Field of Classification Search .................. 438/401; 257/E21.529, E23.179
See application file for complete search history.

(56) References Cited

U.S. PATENT DOCUMENTS

| 6,933,204 | B2 | 8/2005 | Sarma et al. |
| 7,220,655 | B1 | 5/2007 | Hause et al. |
| 2007/0052114 | A1 | 3/2007 | Huang et al. |
| 2007/0210394 | A1* | 9/2007 | Kanakasabapathy et al. ............ 257/421 |
| 2009/0166899 | A1* | 7/2009 | Van Haren ................. 257/797 |

FOREIGN PATENT DOCUMENTS

JP      2002-64055      2/2002

* cited by examiner

*Primary Examiner* — David S Blum
(74) *Attorney, Agent, or Firm* — Finnegan, Henderson, Farabow, Garrett & Dunner, L.L.P.

(57) ABSTRACT

A mark forming method includes forming a first mask layer on a semiconductor substrate; forming at least three first patterns having periodicity on the first mask layer; forming a second mask layer on the first mask layer having the first patterns formed thereon; and forming an opening in the second mask layer to cover at least two patterns on ends of the at least three first patterns, thereby forming a mark composed of exposed ones of the first patterns.

17 Claims, 17 Drawing Sheets

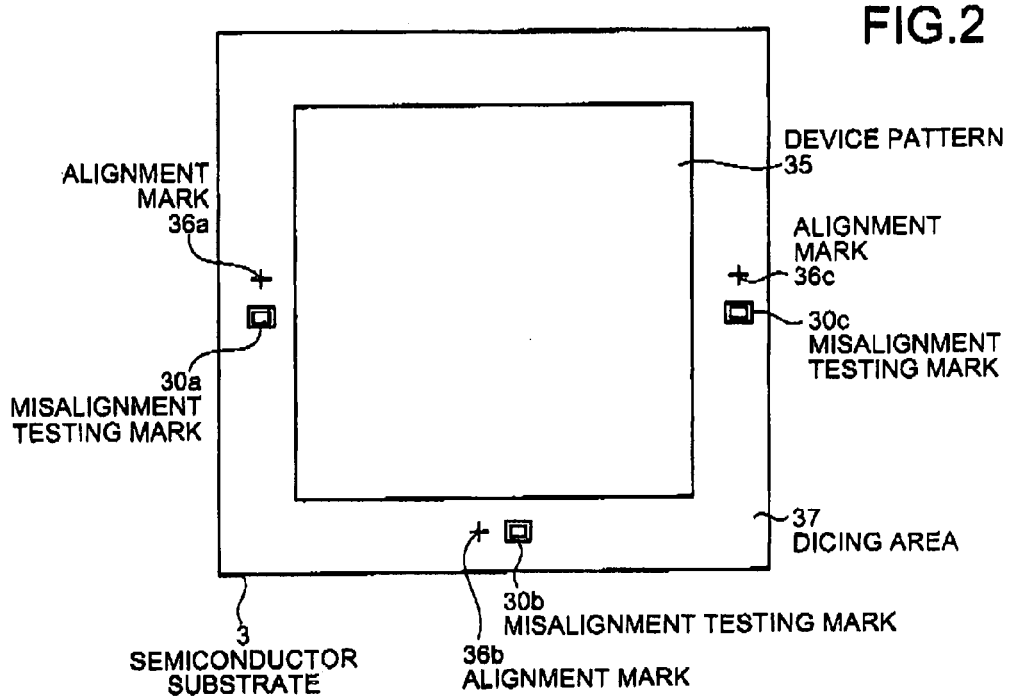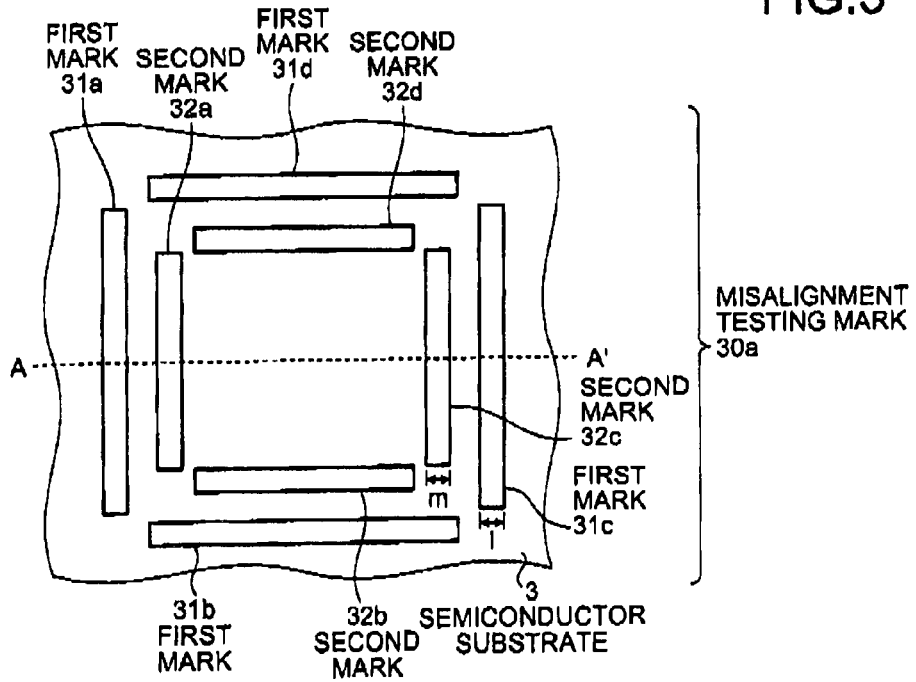

ALIGNMENT ACCURACY
MEASUREMENT FOR FIRST LAYER
WITH RESPECT TO
UNDERLYING LAYER

ALIGNMENT ACCURACY
MEASUREMENT FOR SECOND LAYER
WITH RESPECT TO
UNDERLYING LAYER

LOWER LAYER FORMATION

FIRST LAYER FORMATION

SECOND LAYER FORMATION

LOWER RESIST FILM (LINE) OF
FIRST LAYER

LOWER LAYER FORMATION

FIRST LAYER FORMATION

SECOND LAYER FORMATION

MARK FORMING METHOD AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2008-78580, filed on Mar. 25, 2008; the entire contents of which are incorporated herein by reference.

BACKGROUND OF THE INVENTION

1. Field of the Invention

The present invention relates to a mark forming method and a method for manufacturing a semiconductor device.

2. Description of the Related Art

In the process for manufacturing a semiconductor device, plural mask patterns are sequentially laid on a semiconductor wafer and then exposed to form device patterns at plural mask levels aligned with each other. During the exposure, a "misalignment test" for testing whether a device pattern of a reference layer and a device pattern of an upper layer are properly aligned is performed to prevent a trouble such as disconnection or leakage between the device pattern of the reference layer and the device pattern of the upper layer. For this reason, misalignment testing marks for testing misalignment of the device patterns are formed on the semiconductor wafer, in addition to the device patterns.

With the recent progress of downsizing of the semiconductor device, the sizes of the misalignment testing marks become relatively large compared to the sizes of the device patterns. In this case, an aberration or a focus position of an optical system of an exposure apparatus has different effects on the misalignment testing marks and the device patterns. When the effects of the aberration or the focus position are different, amounts of displacement in transfer positions of the misalignment testing marks and the device patterns, which are transferred on the semiconductor wafer, become different. Therefore, even when an amount of misalignment between the misalignment testing marks is minimized by the misalignment test, an alignment error in the device patterns may be large.

JP-A 2002-64055 (KOKAI) proposes a method of making the size, shape and the like of the misalignment testing mark the same as those of the device pattern, for example. This method enables to make the amounts of displacement in the transfer positions of the misalignment testing mark and the device pattern comparable and to minimize the alignment error in the device patterns.

However, when the misalignment testing mark is a set of plural fine patterns locally formed in an area with a finite width, periodicity or uniformity in pattern arrangement becomes discontinuous at a boundary (edges) of the area occupied by the misalignment testing mark. Therefore, the misalignment testing mark does not become optically equivalent to the device pattern. Accordingly, the pattern shape of the misalignment testing mark at the boundary (edges) is deformed due to the aberration or the like and becomes different from that of the device pattern, so that measurement accuracy in the misalignment test is adversely reduced.

BRIEF SUMMARY OF THE INVENTION

According to one aspect of the present invention, a mark forming method includes forming a first mask layer on a semiconductor substrate; forming at least three first patterns having periodicity on the first mask layer; forming a second mask layer on the first mask layer having the first patterns formed thereon; and forming an opening in the second mask layer to cover at least two patterns on ends of the at least three first patterns, thereby forming a mark composed of exposed ones of the first patterns.

According to another aspect of the present invention, a mark forming method includes forming a first mask layer on a semiconductor substrate; forming at least three first patterns having periodicity on the first mask layer; forming a second mask layer on the first mask layer having the first patterns formed thereon; forming an opening in the second mask layer to cover at least two patterns on ends of the at least three first patterns, thereby forming second patterns composed of exposed ones of the first patterns; and processing a lower layer below the first mask layer using the second patterns to form a mark on the lower layer.

According to still another aspect of the present invention, a method for manufacturing a semiconductor device includes forming a first mask layer on a semiconductor substrate; forming at least three first patterns having periodicity on the first mask layer; forming a second mask layer on the first mask layer having the first patterns formed thereon; forming an opening in the second mask layer to cover at least two patterns on ends of the at least three first patterns, thereby forming a mark composed of exposed ones of the first patterns; and manufacturing a semiconductor device by using the mark as a misalignment testing mark or an alignment mark at exposure.

BRIEF DESCRIPTION OF THE DRAWINGS

FIG. 2 is a plan view of a semiconductor substrate including a misalignment testing mark formed thereon according to the first embodiment;

FIG. 3 is a plan view of an example of the misalignment testing mark according to the first embodiment;

DETAILED DESCRIPTION OF THE INVENTION

Exemplary embodiments of a mark forming method and a method for manufacturing a semiconductor device according to the present invention will be explained below in detail with reference to the accompanying drawings. The present invention is not limited to the following descriptions, and various changes can be made without departing from the scope of the invention.

First Embodiment

Figure 1:
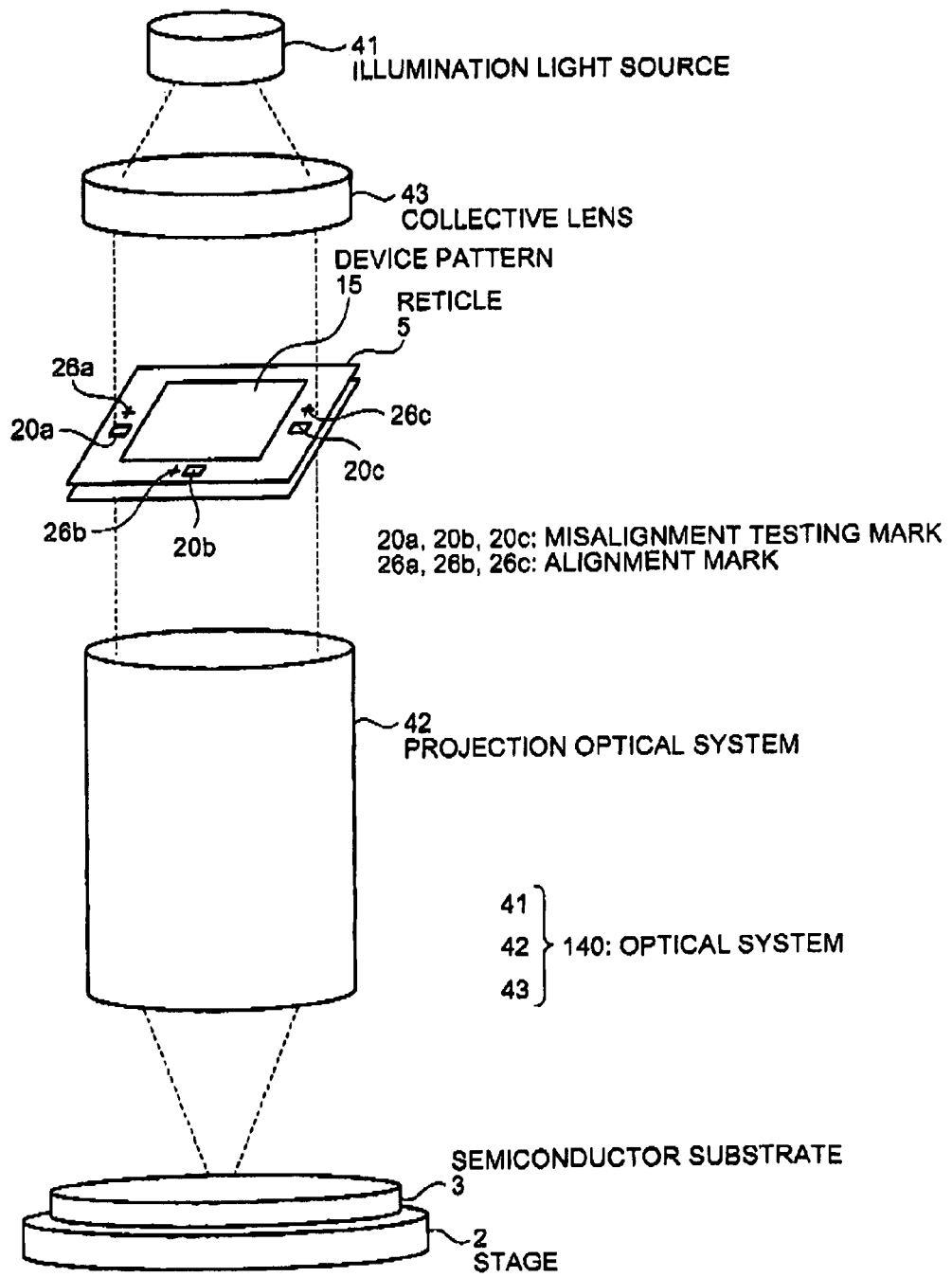
FIG. 1 is a schematic diagram of a reduced-projection exposure apparatus used in a method for forming a misalignment testing mark according to a first embodiment of the present invention.

A method for forming a misalignment testing mark is explained in a first embodiment of the present invention, as a mark forming method and a semiconductor-device manufacturing method that achieve high-accuracy measurement of a mask position, employed in a technique that enables to form a mask using a photosensitive resin film to process a processing target film. For example, a pattern of a misalignment testing mark is subject to reduced projection exposure onto a semiconductor substrate 3 using a reduced-projection exposure apparatus including an optical system 140 and a stage 2 as shown in FIG. 1. The optical system 140 of the reduced-projection exposure apparatus shown in FIG. 1 includes an illumination light source 41, a collective lens 43 located below the illumination light source 41, and a projection optical system 42 located below the collective lens 43.

A reticle 5 including a device pattern 15 that receives light applied by the illumination light source 41 and collected by the collective lens 43, alignment marks 26a, 26b, and 26c, and misalignment testing marks 20a, 20b, and 20c is located between the collective lens 43 and the projection optical system 42. The reticle 5 is formed as a set of plural pieces arranged between the collective lens 43 and the projection optical system 42 in sequence according to a flow of sequential processes. The semiconductor substrate 3 is placed on the stage 2. Light that has transmitted through the device pattern 15 and the misalignment testing marks 20a, 20b, and 20c, respectively, is focused by the projection optical system 42 to form an image on the semiconductor substrate 3.

Plural rectangular chip areas as shown in FIG. 2 are arranged on the semiconductor substrate 3 in a matrix by a step-and-repeat method, being successively shifted, as reduced projected images of the pattern formed on the reticle 5. As a result, misalignment testing marks 30a, 30b, and 30c, and alignment marks 36a, 36b, and 36c near the corresponding misalignment testing marks, which correspond to the misalignment testing marks 20a, 20b, and 20c, and the alignment marks 26a, 26b, and 26c of the reticle 5, respectively, are arranged on a dicing area 37 surrounding the rectangular chip area. Device patterns 35 of plural layers are formed superposedly in the chip area surrounded by the dicing area 37.

FIG. 3 is an example of an enlarged plan view of the misalignment testing mark 30a shown in FIG. 2. The misalignment testing mark 30a has first marks 31a, 31b, 31c, and 31d arranged to form four sides of a square on the surface of the semiconductor substrate 3, and second marks 32a, 32b, 32c, and 32d formed inside of the square formed by the first marks 31a to 31d. The second marks 32a, 32b, 32c, and 32d can be formed outside of the square formed by the first marks 31a to 31d.

The first marks 31a, 31b, 31c, and 31d correspond to a pattern of a reference layer (first layer), and the second marks 32a, 32b, 32c, and 32d correspond to a pattern of an upper layer (second layer), to be aligned with the pattern of the reference layer (first layer). The upper layer (second layer) does not necessarily need to be just above the reference layer (first layer), and another layer can be located between the reference layer and the upper layer. That is, in this specification, it is only necessary that the reference layer (first layer) and the upper layer (second layer) be two layers that are to be logically aligned with each other.

The misalignment test is performed by using a difference in distance between a midpoint of a distance between gravity center positions of the first mark 31a and the first mark 31c, and a midpoint of a distance between gravity center positions of the second mark 32a and the second mark 32c. The misalignment test is also performed by using a difference in distance perpendicular to the distances above mentioned between a midpoint of a distance between gravity center positions of the first mark 31b and the first mark 31d, and a midpoint of a distance between gravity center positions of the second mark 32b and the second mark 32d.

Figure 4:
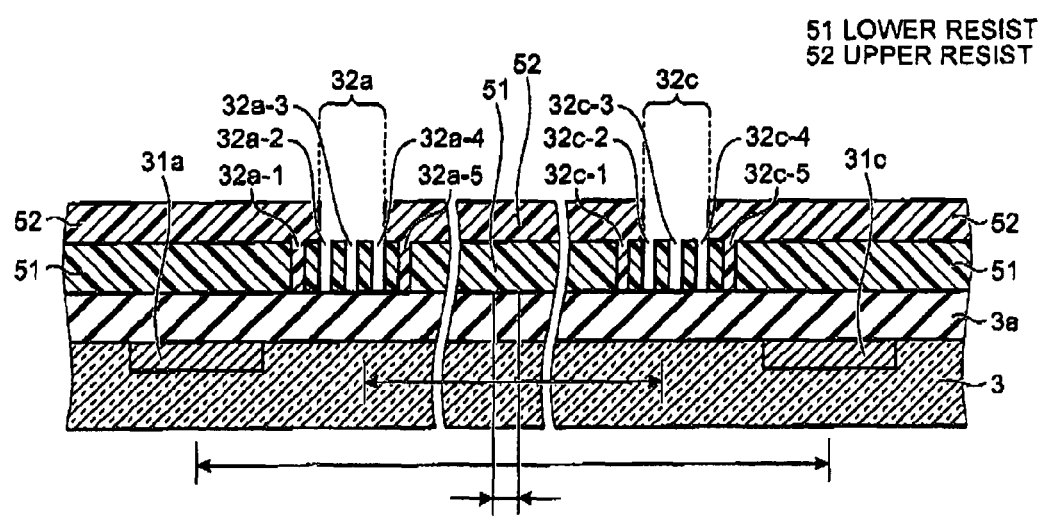
FIG. 4 is a cross-sectional view taken along the line A-A' in FIG. 3.

FIG. 4 is a cross-sectional view taken along the line A-A' in FIG. 3. FIG. 4 depicts the first marks 31a and 31c corresponding to the pattern of the reference layer (first layer), and the second marks 32a and 32c, as an example. The first marks 31a and 31c are formed by embedding a conductive material in grooves formed by etching the semiconductor substrate 3, for example. The second marks 32a and 32c are formed by selectively exposing contact holes located on ends among plural contact holes formed in the second layer and covering the exposed contact holes with a third layer. In this example, the second mark 32a that is formed by covering contact holes 32a-1 and 32a-5 located on ends of contact holes 32a-1, 32a-2, 32a-3, 32a-4, and 32a-5 as fine patterns with the third layer, and the second mark 32c that is formed by covering contact holes 32c-1 and 32c-5 located on ends of contact holes 32c-1, 32c-2, 32c-3, 32c-4, and 32c-5 with the third layer are shown.

Figure 5:
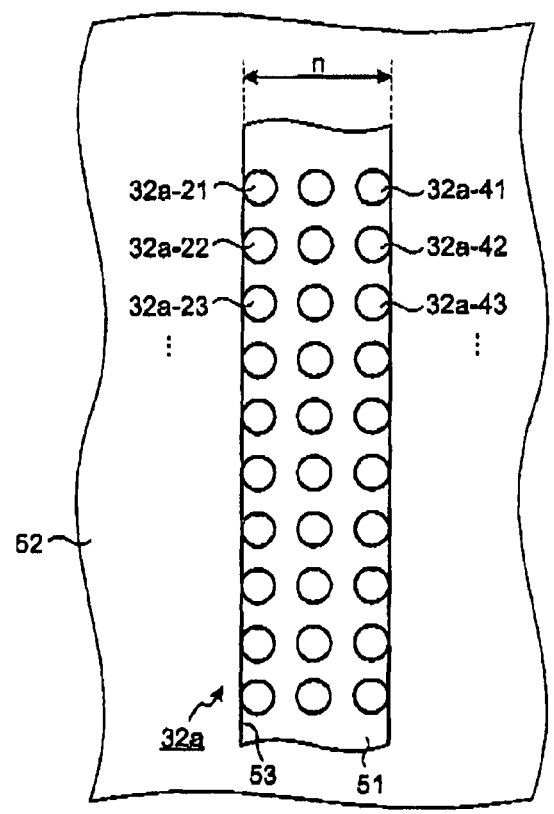
FIG. 5 is a plan view of a second mark (a second mark area) in FIG. 4.

The second mark (second mark area) 32a shown on the left in the cross-sectional view of FIG. 4 is composed of a periodical pattern of contact holes including contact holes 32a-21, 32a-22, 32a-23, . . . , 32a-41, 32a-42, 32a-43, . . . in coplanar shapes arranged in lines, as shown in a plan view of FIG. 5. The periodical pattern of these contact holes is exposed through an opening 53 formed in an upper resist (third layer) 52 as a mask layer. The periodical pattern of the contact holes exposed through the opening 53 can be made as a rectangular mark seen in a broad perspective, and this rectangular mark is used for the second mark (second mark area) 32a.

The line width n of the contact holes 32a-21, 32a-22, 32a-23, . . . , 32a-41, 32a-42, 32a-43, . . . is approximately equal to at least a partial line width of the device pattern 35 in the chip area as shown in FIG. 2. The height (depth) of the contact holes, the pitch of arrangement thereof, and the density thereof in the pattern are set to approximately the same as those of the device pattern 35. That is, the periodical pattern of the contact holes including the contact holes 32a-21, 32a-22, 32a-23, . . . 32a-41, 32a-42, 32a-43, . . . includes at least part of the device pattern 35 or an equivalent pattern thereof.

Figure 6:
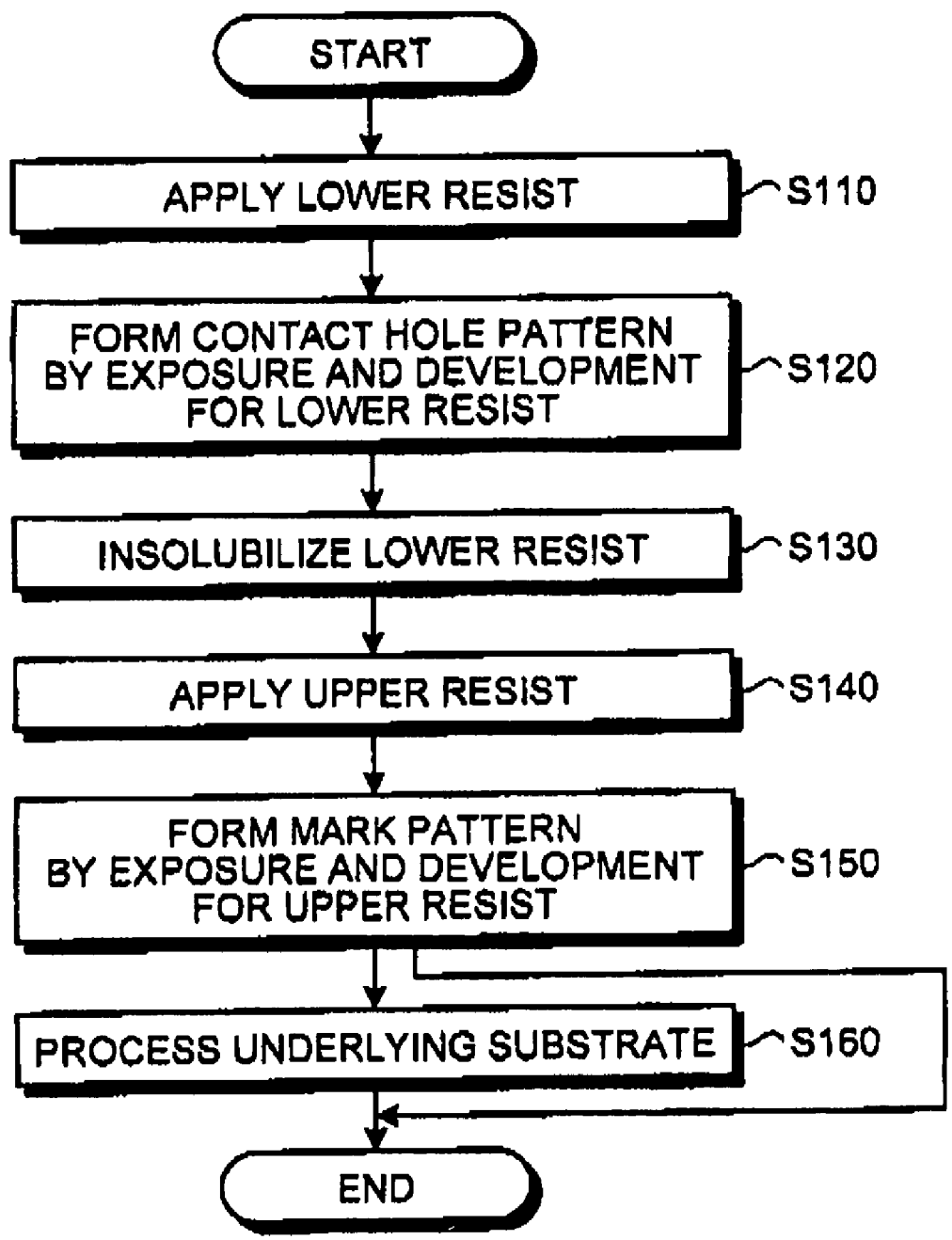
FIG. 6 is a flowchart of the method for forming a misalignment testing mark according to the first embodiment.
Figure 7A:
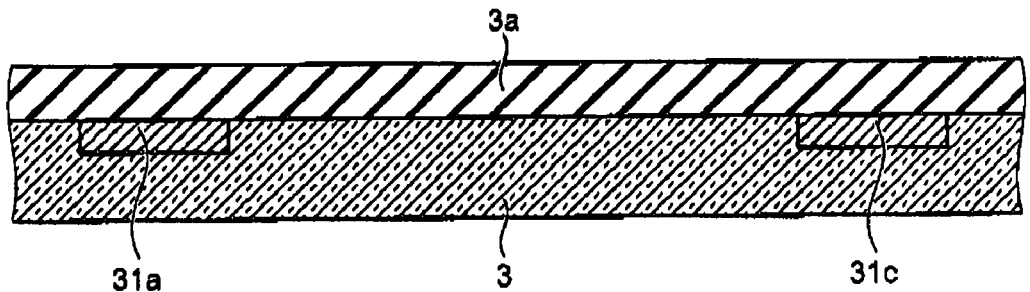
FIGS. 7A to 7C are cross-sectional views for explaining the method for forming a misalignment testing mark according to the first embodiment.

A method for forming the misalignment testing mark according to the first embodiment is explained next with reference to FIGS. 6 to 10. FIG. 6 is a flowchart of a method for forming the misalignment testing mark according to the first embodiment. FIGS. 7A to 7C, 8A to 8C, and 10 explain the method for forming the misalignment testing mark according to the first embodiment. FIG. 9 is a schematic diagram of a quadrupole illumination used in formation of the misalignment testing mark according to the first embodiment.

The method for forming the misalignment testing mark explained below is only an example, and can be realized by various other methods including modifications thereof. Similarly, a pattern disclosed in the explanations below is only an example, and various other patterns can be used. In an example below, a photoresist film (hereinafter, "resist film") is used for a "photosensitive film" as a mask layer; however, a film other than the resist film, such as a photosensitive resin film, can be used for the "photosensitive film". The resist film is preferably used considering accuracy in micromachining and demands for uniformity or reproducibility.

An oxide film ($SiO_2$ film) is first formed by a thermal oxidation method on a surface of the semiconductor substrate (Si substrate) 3 doped with desired impurities. A resist film is then applied entirely onto the oxide film, and the resist film is exposed and developed by a photolithography technique. The oxide film is then etched by a reactive ion etching (RIE) method using the resist film as an etching mask, to selectively expose part of the semiconductor substrate 3.

After the resist layer is removed, the exposed area of the semiconductor substrate 3 is etched by the RIE method using the oxide film as an etching mask, and then the oxide film is removed after the etching. In this way, grooves for the first marks 31a and 31c having a depth of about 100 nanometers to 300 nanometers are formed, for example. A conductor film is then formed on the semiconductor substrate 3 to embed the grooves. The surface of the conductor film is then set back, for example by using a chemical mechanical polishing (CMP) method to leave the conductor in the grooves. In this way, the first marks 31a and 31c are formed as shown in FIG. 7A. An insulating layer 3a is then formed on the entire surface of the semiconductor substrate 3. The reference layer has the plan view as shown in FIG. 3 in a form of a rectangular area surrounded by the four first marks 31a, 31b, 31c, and 31d separated from each other. In the chip area as shown in FIG. 2, the corresponding device pattern of the reference layer is formed.

Figure 7B:
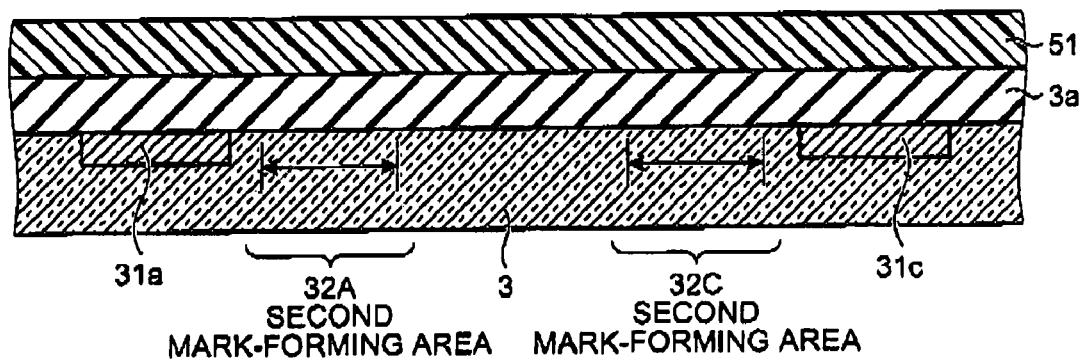
Figure 7C:
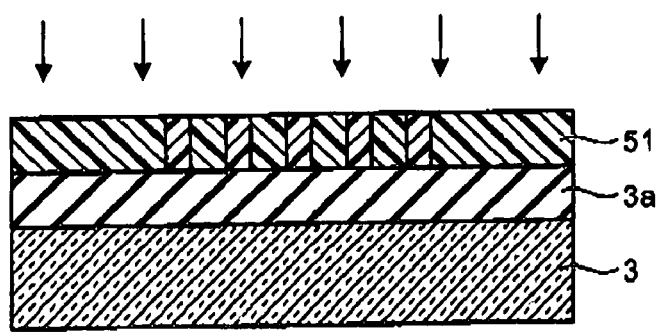
Figure 8A:
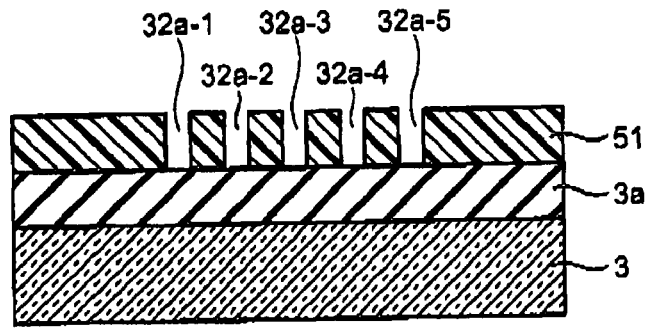
FIGS. 8A to 8C are cross-sectional views for explaining the method for forming a misalignment testing mark according to the first embodiment.

Another resist film (positive resist film) 51 is then applied entirely on the semiconductor substrate 3 as shown in FIG. 7B. The resist film formed now is referred to as the lower resist 51 (Step S110). As an example of second mark-forming areas in which the second marks are formed, second mark areas 32A and 32C in which the second marks 32a and 32c are formed, respectively, are shown in FIG. 7B. Predetermined steps of baking (prebaking), curing, and the like are then performed. Reduced projection exposure of a pattern of four second mark areas, that is, the four second marks 32a, 32b, 32c, and 32d is then performed using a first test mask (test reticle), being aligned with the rectangular area surrounded by the four first marks 31a, 31b, 31c, and 31d, as shown in FIG. 7C. The alignment marks 26a, 26b, and 26c, and the alignment marks 36a, 36b, and 36c as shown in FIGS. 1 and 2 are used for the alignment.

Specifically, to form the pattern of the four second marks 32a, 32b, 32c, and 32d, a 110-nanometer 1:1 contact hole pattern is formed by a quadrupole illumination in areas in which the four second marks (second mark areas) 32a, 32b, 32c, and 32d are formed. The exposure is performed with ArF light at a numerical aperture (NA) of 0.78, and illuminations are placed at positions corresponding to ends of a cross as apertures internally contacting circles at σout=0.9 and σin=0.70, as shown in FIG. 9.

Figure 10:
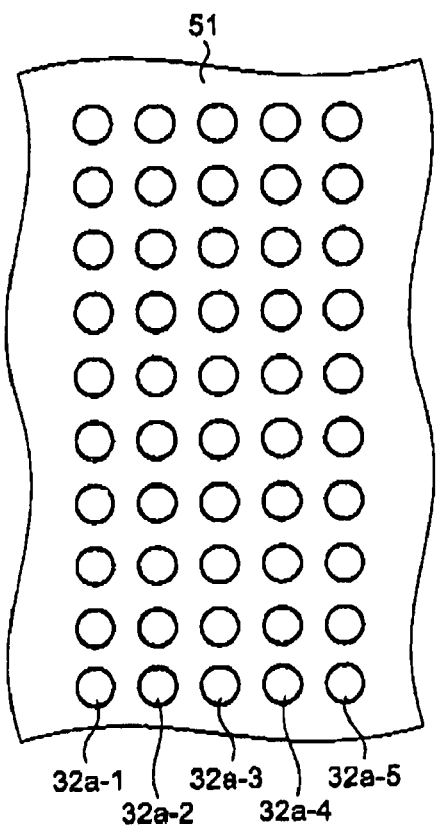
FIG. 10 is a plan view for explaining the method for forming a misalignment testing mark according to the first embodiment.

Contact hole patterns are then formed by a developing process as shown in FIG. 10 (Step S120). FIG. 10 is a plan view immediately after the contact hole patterns are formed as periodical patterns. FIG. 8A is a cross-sectional view of an area in which the second mark 32a is formed (second mark area). The contact holes 32a-1, 32a-2, 32a-3, 32a-4, and 32a-5 are formed as the periodical pattern.

Before a resist as an upper layer is applied, curing with ultra violet rays is performed to insolubilize the lower resist 51 to prevent the lower resist 51 from being dissolved by a developing solution (Step S130). The insolubilization can be achieved by implantation of $Ar^+$ ions, baking, a freezing material, or the like. The insolubilization can be also achieved by using a resist as a combination of solvents that do not cause the resists of the upper and lower layers to be dissolved in each other.

Figure 8B:
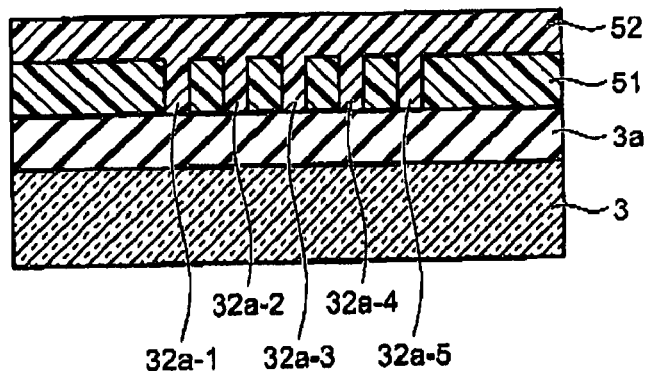
Figure 8C:
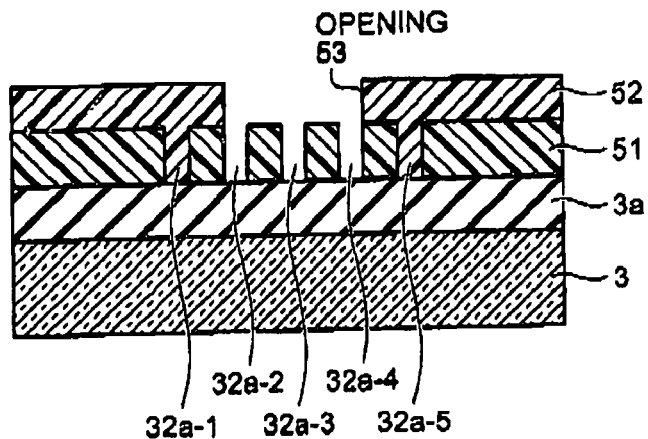
Figure 9:
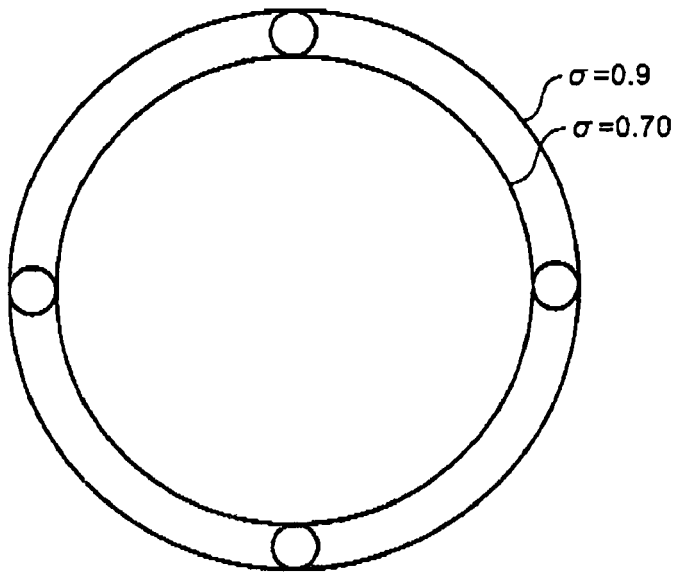
FIG. 9 is a schematic diagram of a quadrupole illumination used in the method for forming a misalignment testing mark according to the first embodiment.

To obtain a group of patterns of a desired mark shape from the pattern lines of the contact holes, the resist film 52 is then applied onto the lower resist 51 as shown in FIG. 8B. The resist film formed here is referred to as the upper resist 52 (Step S140). The upper resist 52 is subjected to exposure and development for patterning, to form the opening 53 as shown in FIG. 8C (Step S150). The illumination is performed by using an annular illumination in a condition of NA=0.78, σ=0.9, and ε=0.68.

The opening 53 is formed in the upper resist 52 to cover lines of the contact holes 32a-1 and 32a-5 located on opposite ends of the lines of the contact holes 32a-1, 32a-2, 32a-3, 32a-4, and 32a-5 formed in the periodical pattern. Accordingly, a periodical pattern of the contact holes including the contact holes 32a-21, 32a-22, 32a-23, . . . , 32a-41, 32a-42, 32a-43, . . . arranged in lines is exposed as shown in FIG. 5.

By forming the pattern of the upper resist 52 in this way, the periodical pattern of the contact holes formed in the lower resist 51 and exposed through the opening 53 can be made as a rectangular mark seen in a broad perspective. A semiconductor device can be manufactured by using this mark for the misalignment testing mark.

The opening 53 is formed to cover the lines of the contact holes 32a-1 and 32a-5 on the opposite ends of the pattern lines of the contact holes; however, the opening 53 needs to be formed to cover at least a line of the contact holes on one end. It is preferable that lines on the opposite ends of the periodical lines of the contact holes be covered. In this case, the lines on the opposite ends of the pattern lines of the contact holes needs to be covered, and thus two or more lines from the opposite ends can be covered, for example, to form the opening.

The underlying insulating layer 3a can be processed by using this resist pattern to form a mark (Step S160). This mark can be used for the alignment mark during exposure performed in the subsequent step, or used for the misalignment testing mark.

In the first embodiment, the pattern of the contact holes is formed as a fine pattern in the lower resist 51. However, the fine pattern formed in the lower resist 51 is not specifically limited to the contact hole pattern. A line-and-space pattern shape, a rectangular shape, a T shape, an L shape, or a combination thereof can be used so long as the height (depth) of the contact holes, the pitch of arrangement thereof, and the density thereof in the pattern are equivalent to those of the device pattern 35.

The lower resist 51 can be replaced by a hard mask. As materials of the hard mask, a nitride or an oxide such as TiN or $SiO_2$, or a silicon-containing material such as amorphous silicon can be used. In this case, the insolubilization of the lower layer is not needed.

With the mark forming method according to the first embodiment, the misalignment testing mark is formed to include at least part of the device pattern or an equivalent pattern thereof. Therefore, the misalignment testing mark is affected by an error due to effects of the aberration of the projection optical system used in the pattern transfer to the same degree as the device patterns, so that the amounts of displacement in the both patterns become the same. Accordingly, the mark forming method according to the first embodiment can provide highly-accuracy alignment, and enables high-accuracy measurement during the alignment error measurement.

With the mark forming method according to the first embodiment, only the contact holes (for example, 32a-1 and 32a-5) at the boundary (ends or edges) of each of the second marks (second mark areas) 32a, 32b, 32c, and 32d can be selectively covered. Therefore, occurrence of an inappropriate pattern caused by the discontinuity in the periodicity or uniformity of the fine pattern at the edges can be prevented, and thus the misalignment test more exactly reflecting the actual device pattern can be performed. In addition, processing steps can be reduced as compared to a case in which the contact holes at the boundary (edges) of the second mark are processed and removed, and thus the processes can be simplified and the process costs can be reduced.

A method for manufacturing a semiconductor device according to the first embodiment uses the mark forming method according to the first embodiment. Therefore, high-accuracy alignment can be achieved, and high-accuracy measurement can be performed during the alignment error measurement. Accordingly, a high-quality semiconductor device with high positional accuracy can be manufactured.

Second Embodiment

Figure 11A:
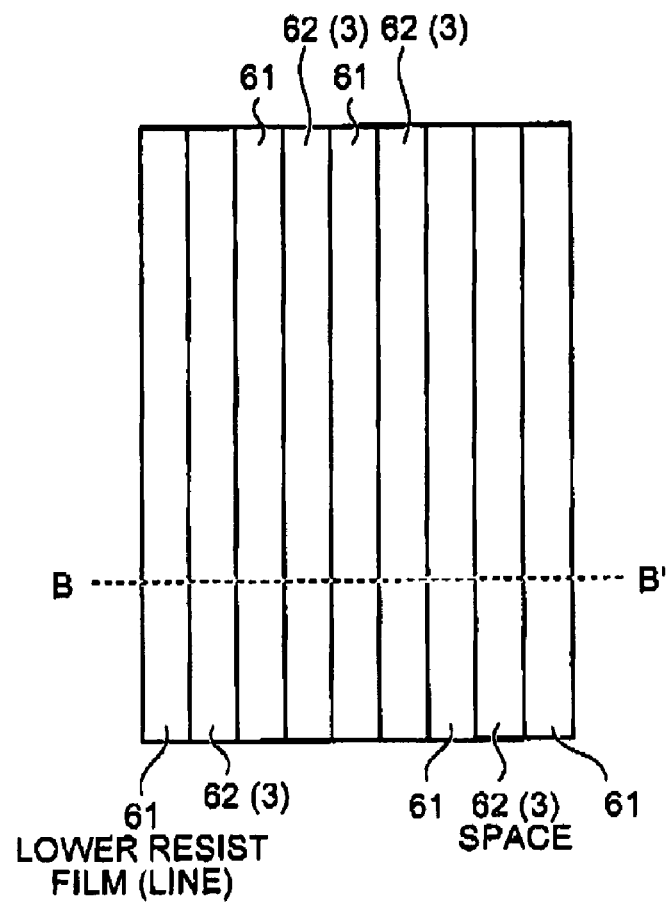
FIGS. 11A and 11B are schematic diagrams for explaining a method for forming a misalignment testing mark according to a second embodiment of the present invention.
Figure 11B:
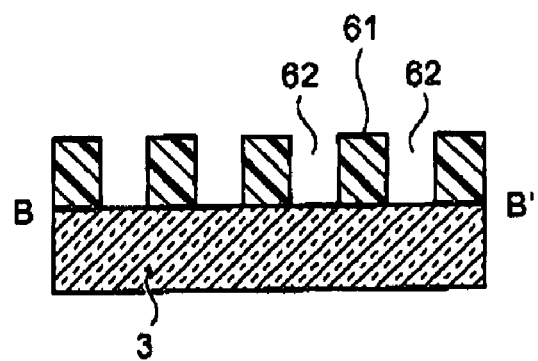

In a second embodiment of the present invention, formation of a pattern on the semiconductor substrate 3 as the reference layer is explained. An oxide film ($SiO_2$ film) is first formed on the surface of the semiconductor substrate 3 doped with desired impurities by the thermal oxidation method. A lower resist film is then applied entirely on the oxide film, and a 1:1 line-and-space pattern is transferred on the lower resist film by the photolithography technique. The development is then performed to form spaces 62 as shown in FIGS. 11A and 11B. In this way, lines and spaces of a lower resist film (line) 61 and the space 62 are formed. FIG. 11A is a plan view of a line-and-space pattern after the lower resist film (line) 61 and the space 62 are formed. FIG. 11B is a cross-sectional view taken along the line B-B' in FIG. 11A.

Figure 12A:
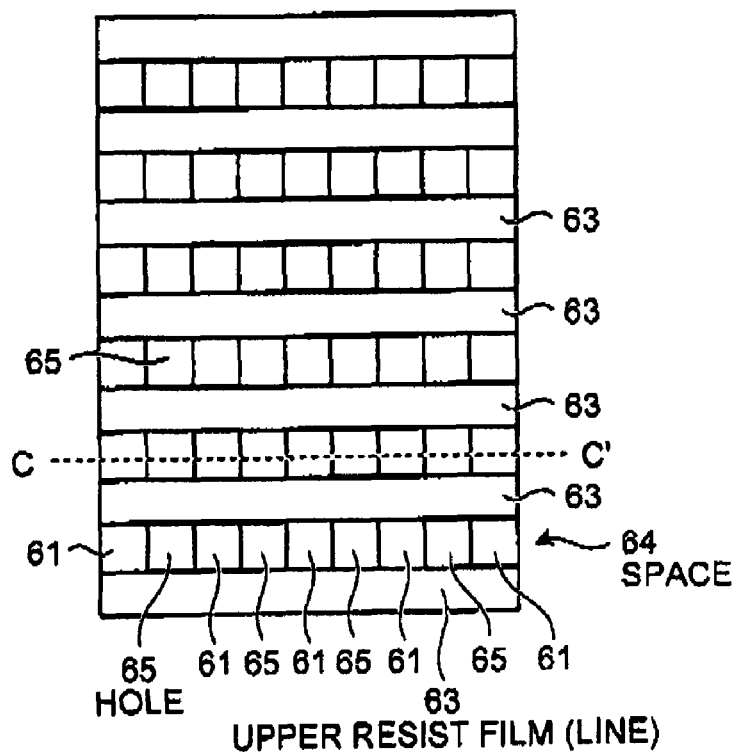
FIGS. 12A and 12B are schematic diagrams for explaining the method for forming a misalignment testing mark according to the second embodiment.
Figure 12B:
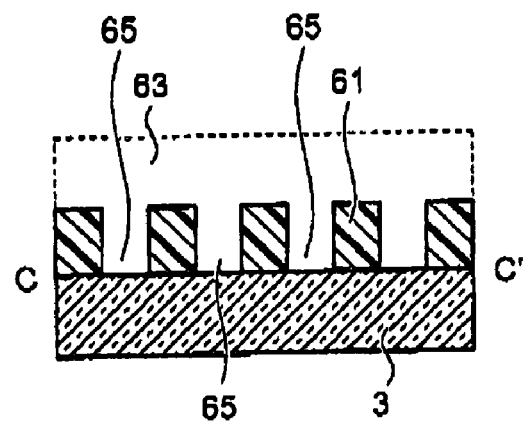

Before a resist as an upper layer is applied, the lower resist film 61 is insolubilized to prevent the lower resist film 61 from being dissolved by a resist solvent, like in the first embodiment. An upper resist film is then formed on the lower resist film (line) 61. A 1:1 line-and-space pattern perpendicular to the extending direction of the line-and-space pattern (the lower resist film 61 and the space 62) of the lower layer is transferred on the upper resist film by the photolithography technique to form spaces 64. In this way, lines and spaces of an upper resist film (line) 63 and the space 64 are formed as shown in FIGS. 12A and 12B.

At this time, two layers of the line-and-space pattern 61 and 62 of the lower layer and the line-and-space pattern 63 and 64 of the upper layer, which are perpendicular to each other, are superposed so that the spaces 62 and 64 of these layers form holes. In this way, as shown in FIGS. 12A and 12B, a pattern of holes 65 arranged periodically is formed of the resist patterns of the two layers (the upper and lower layers). FIG. 12A is a plan view of the pattern after the upper resist film (line) 63 and the space 64 are formed. FIG. 12B is a cross-sectional view taken along the line C-C' in FIG. 12A.

Figure 13A:
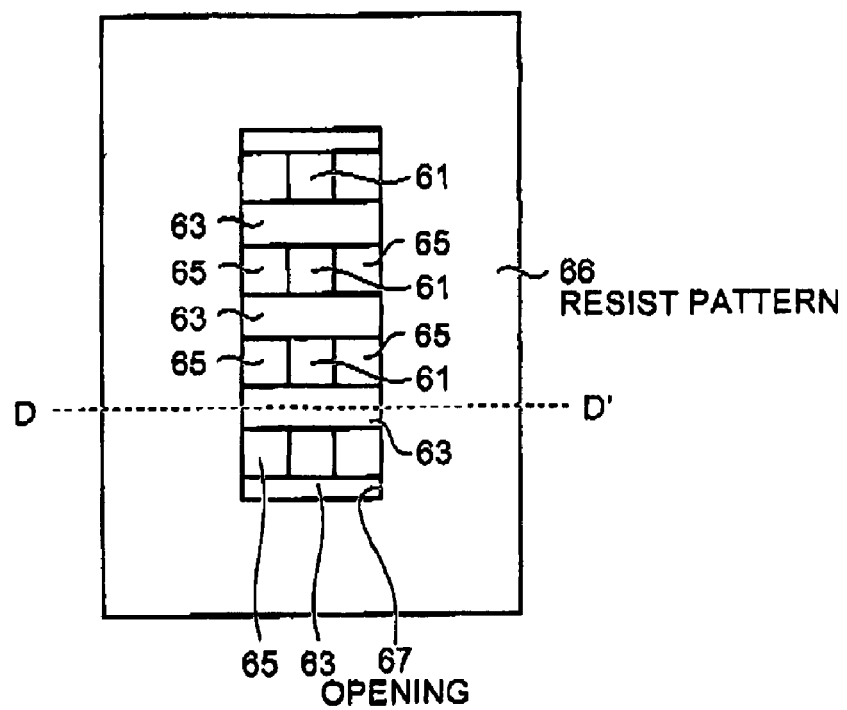
FIGS. 13A and 13B are schematic diagrams for explaining the method for forming a misalignment testing mark according to the second embodiment.
Figure 13B:
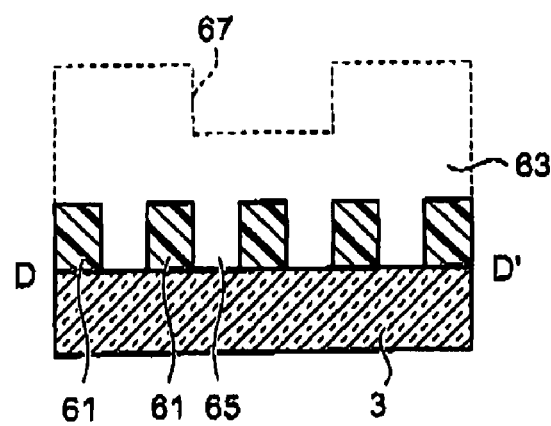

For the pattern of the holes 65 thus formed, another resist pattern 66 having a predetermined opening 67 that covers the holes 65 in lines on ends of the pattern is formed as shown in FIGS. 13A and 13B, like in the case of the pattern of the contact holes in the first embodiment. Accordingly, a periodical pattern of the holes 65 is exposed by the resist pattern 66 with the holes 65 in the lines on the ends being covered, like in the case of the first embodiment. FIG. 13A is a plan view of the pattern after the resist pattern 66 is formed. FIG. 13B is a cross-sectional view taken along the line D-D' in FIG. 13A. The size of the holes 65, the pitch of arrangement thereof, and the density thereof in the pattern are set partially approximately the same as those of the device pattern 35. That is, the periodical pattern of the holes 65 exposed through the resist pattern 66 includes at least part of the device pattern 35 or an equivalent pattern thereof.

The semiconductor substrate 3 is then processed using the periodical pattern of the holes 65, and the processed portions are embedded with an appropriate material, thereby forming a mark on the substrate. This mark can be used as the alignment mark during exposure in the subsequent step, or used as a reference mark for the misalignment test.

With the mark forming method according to the second embodiment, the periodical pattern of the holes 65 is formed to include at least part of the device pattern 35, or an equivalent pattern thereof. Therefore, the periodical pattern is affected by an error due to effects of the aberration of the projection optical system used in the pattern transfer to the same degree as the device pattern, and thus the amounts of displacement of the both patterns become the same. Accordingly, when the mark processed using the periodical pattern of the holes 65 formed by the mark forming method according to the second embodiment is used as the alignment mark during exposure in the subsequent step, high-accuracy alignment can be achieved. When this mark is used as the reference mark for the misalignment test, high-accuracy measurement can be performed during the alignment error measurement.

With the mark forming method according to the second embodiment, only the holes 65 at the boundary (edges) of the pattern of the holes 65 initially formed can be selectively covered. Therefore, occurrence of an inappropriate pattern caused by discontinuity in the periodicity or uniformity of the fine pattern at the edges can be prevented, and thus the misalignment test more exactly reflecting the actual device pattern can be performed.

A method for manufacturing a semiconductor device according to the second embodiment uses the mark forming method according to the second embodiment. Therefore, high-accuracy alignment can be achieved, and high-accuracy measurement can be performed during the alignment error measurement, which enables to manufacture a high-quality semiconductor device with high positional accuracy.

Third Embodiment

Figure 14:
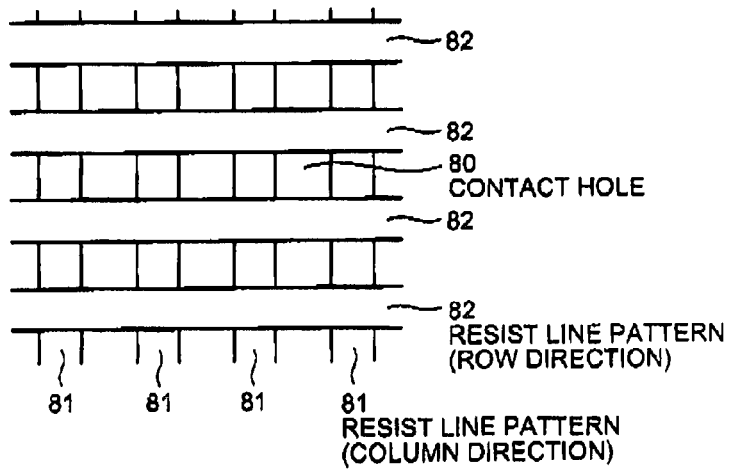
FIG. 14 is a plan view of resist crosspoint exposure.

In one of techniques that enables to form fine contact holes in a semiconductor device, a column resist line pattern 81 and a row resist line pattern 82 can be combined to form contact holes 80 in one layer, as shown in FIG. 14 (hereinafter, this technique is referred to as "resist crosspoint exposure"). In one of methods for measuring accuracy in alignment between lower and upper layers in the lithography step for a semiconductor device, a so-called "bar-in-bar type" mark (misalignment testing mark) is used. In this method, bar-like marks are formed in X and Y directions.

In the resist crosspoint exposure, two resist forming steps for forming the column resist line pattern and the row resist line pattern are required. Therefore, the misalignment testing mark for the lower layer needs to be prepared in each resist forming step, and thus the alignment accuracy measurement is performed twice.

Figure 15:
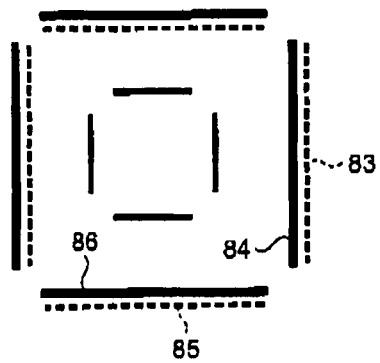
FIG. 15 is a schematic diagram of a conventional misalignment test.

In the resist crosspoint exposure, the fine pattern is formed by an exposure apparatus that uses a dipole illumination, or the like. Therefore, the bar-like marks other than those in a direction in which the resolution of the exposure apparatus is enhanced are formed in defective conditions. Accordingly, completions of alignment-accuracy measurement marks in the column direction (X direction) and the row direction (Y direction) become different. Assume a conventional case (first example) in which the alignment accuracy measurement is performed as the misalignment test for first and second layers with respect to one underlying mark pattern as shown in FIG. 15. In the first example, among the two misalignment testing marks each formed on the first and second layers, defective bar-like marks 83 (formed on the first layer) and 85 (formed on the second layer) are superposed on proper bar-like marks 84 (formed on the second layer) and 86 (formed on the first layer). Therefore, optimization of a measurement recipe for an alignment-accuracy measuring instrument becomes difficult, and thus it becomes difficult to achieve highly-accurate alignment accuracy measurement.

Figure 16:
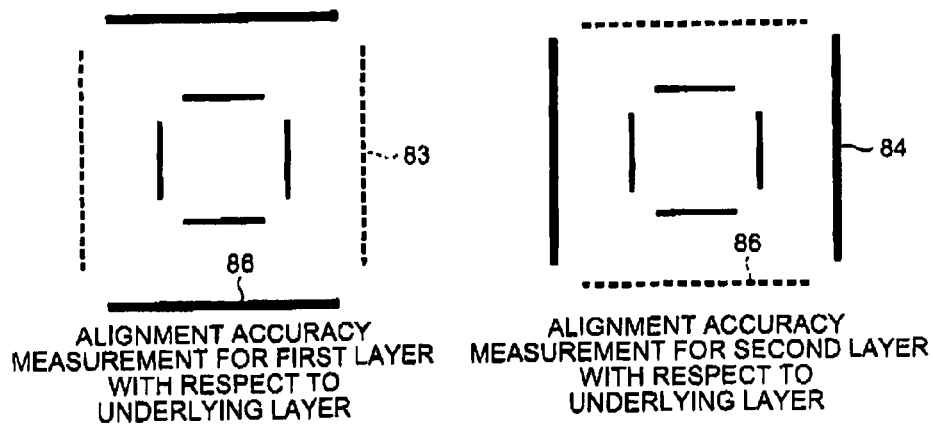
FIG. 16 is another schematic diagram of the conventional misalignment test.

Assume another case (second example) in which the alignment accuracy measurement for the first and second layers with respect to two underlying mark patterns is performed as shown in FIG. 16. In the second example, highly-accurate alignment accuracy measurement can be performed; however, the time required for the measurement is doubled, which doubles an area occupied by the alignment accuracy marks on the semiconductor wafer. Further, conditions in the column and row directions of each bar-like mark are different, and thus the measurement recipe for the alignment-accuracy measuring instrument is difficult to adjust.

In a third embodiment of the present invention, a technique that enables to achieve highly-accurate alignment accuracy measurement for a lower layer when the measurement is performed for the first and second layers only in a direction in which high-accuracy measurement of alignment accuracy is required and when the measurement of alignment accuracy of the first and second layers with respect to one underlying mark pattern is performed is explained. This technique enables to achieve the measurement in a short time with a minimal increase in the area occupied by the alignment accuracy marks on the semiconductor wafer.

Figure 17A:
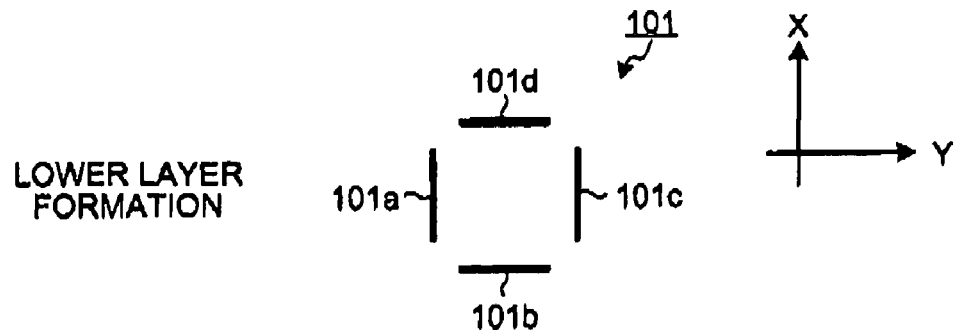
FIGS. 17A to 17C are schematic diagrams for explaining a method for forming a misalignment testing mark according to a third embodiment of the present invention.

In the resist crosspoint exposure, which is a method that enables to form the column resist line pattern 81 and the row resist line pattern 82 combined on the same layer as shown in FIG. 14, a reference position mark 101 for evaluating alignment accuracy is first formed on the reference layer as shown in FIG. 17A. The reference position mark 101 includes reference position marks 101*a*, 101*b*, 101*c*, and 101*d* arranged to form four sides of a square on the reference layer. The longitudinal direction of the reference position marks 101*a* and 101*c* is parallel to the column resist line pattern 81 (X direction). The longitudinal direction of the reference position marks 101*b* and 101*d* is parallel to the row resist line pattern 82 (Y direction).

Figure 17B:
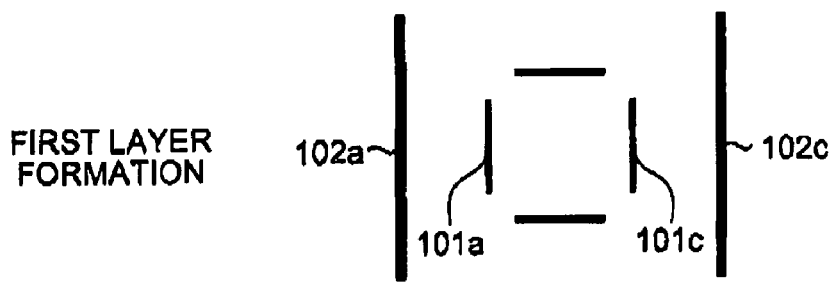

To form small contact holes, the column resist line pattern 81 is formed on the reference layer using the resist pattern of the first layer in the resist crosspoint exposure. At this time, a mask is manufactured so that column marks as bars for the alignment accuracy marks are formed in a direction parallel to the reference position marks 101*a* and 101*c* (parallel to the column resist line pattern 81), and at positions near the reference position marks 101*a* and 101*c* shown in FIG. 17A and sandwiching the reference position marks 101*a* and 101*c*. Lithography processing such as resist application, exposure, and development is then performed. In this way, misalignment testing marks 102*a* and 102*c* are formed as shown in FIG. 17B, by using the same resist pattern of the first layer as used for the column resist line pattern 81. That is, marks parallel to the reference position marks 101*b* and 101*d* (parallel to the row resist line pattern 82) are not formed in this step.

To prevent dissolution of the resist pattern of the first layer, the resist pattern of the first layer is then insolubilized. The row resist line pattern 82 is then formed on the resist pattern of the first layer in a direction at 90 degrees from that of the column resist line pattern 81 (perpendicular to the column resist line pattern 81 in the plane of the reference layer) using the resist pattern of the second layer in the resist crosspoint exposure.

Figure 17C:
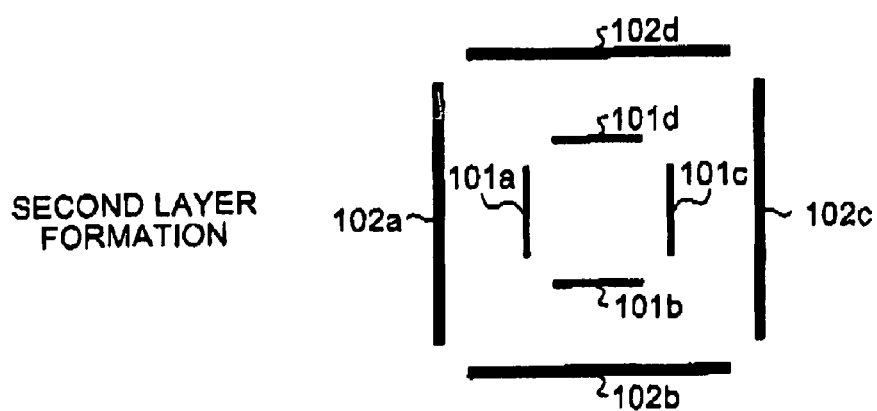

At this time, a mask is manufactured so that row marks as bars for alignment accuracy marks are formed in a direction parallel to the reference position marks 101*b* and 101*d* (parallel to the row resist line pattern 82), and at positions near the reference position marks 101*b* and 101*d* shown in FIG. 17A and sandwiching the reference position marks 101*b* and 101*d*. The lithography processing such as resist application, exposure, and development is then performed. In this way, misalignment testing marks 102*b* and 102*d* are formed as shown in FIG. 17C, by using the same resist pattern of the second layer as used for the row resist line pattern 82. That is, marks parallel to the reference position marks 101*a* and 101*c* (parallel to the column resist line pattern 81) are not formed in this step. Accordingly, the misalignment testing mark 102 (102*a*, 102*b*, 102*c*, and 102*d*) is formed at the positions surrounding the reference position marks 101*a*, 101*b*, 101*c*, and 101*d*.

Figure 18A:
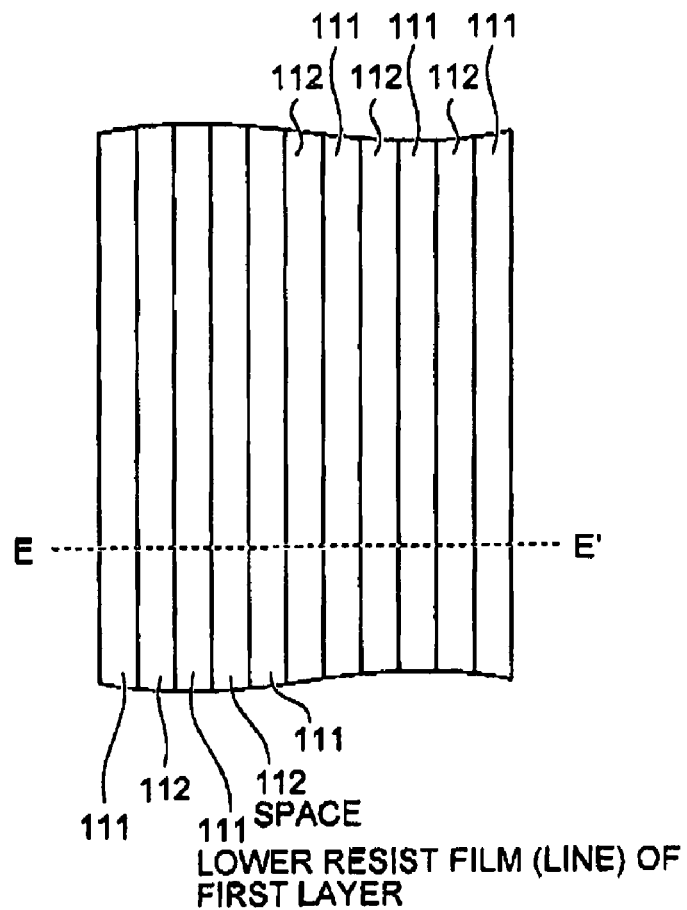
FIGS. 18A and 18B are schematic diagrams for explaining the method for forming a misalignment testing mark according to the third embodiment.
Figure 18B:
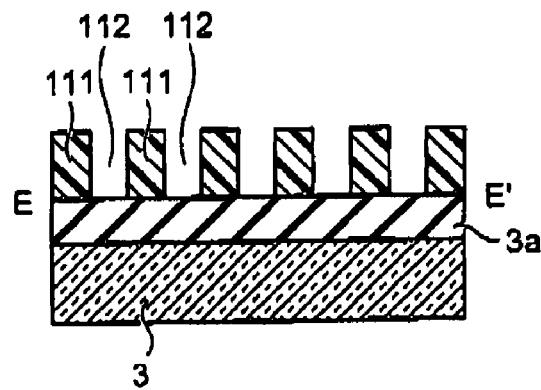

A method for forming the misalignment testing mark 102 (102*a*, 102*b*, 102*c*, and 102*d*) is explained in detail. A lower resist film constituting the lower layer of the resist pattern of the first layer is first applied entirely on the reference layer. A 1:1 line-and-space pattern is then transferred on the lower resist film by the photolithography technique. At this time, it is only necessary to form a resist pattern in lines and spaces extending in the same direction at least on a device-pattern forming area and a mark forming area. Development is then performed to form spaces 112 as shown in FIGS. 18A and 18B. In this way, lines and spaces of a lower resist film (line) 111 and the space 112 of the first layer are formed. FIG. 18A is a plan view of the line-and-space pattern after the lower resist film (line) 111 and the space 112 of the first layer are formed. FIG. 18B is a cross-sectional view taken along the line E-E' in FIG. 18A.

Figure 19A:
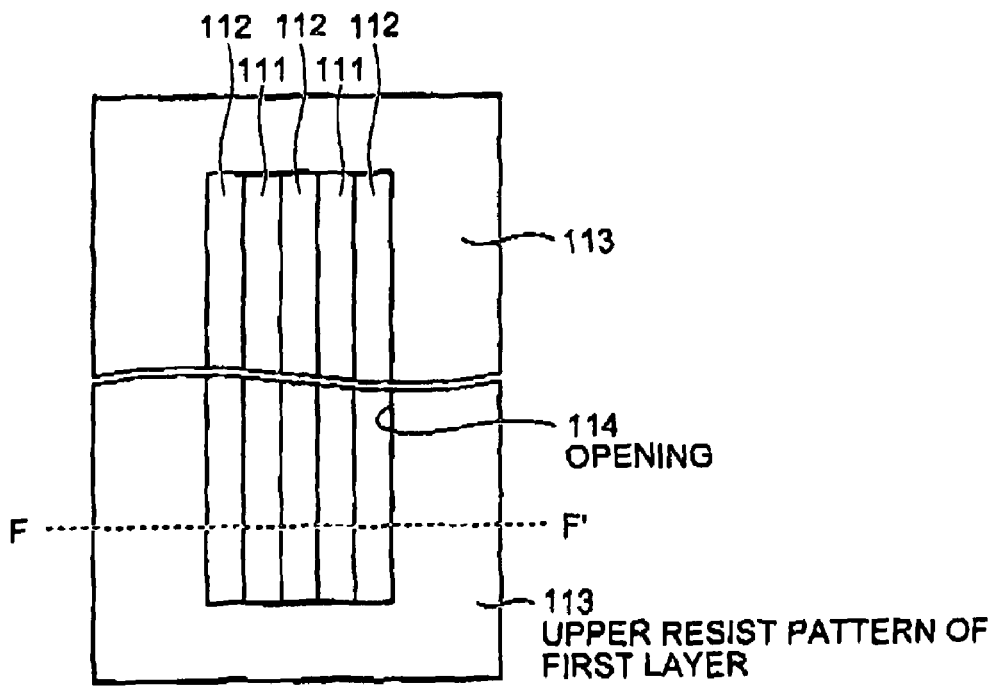
FIGS. 19A and 19B are schematic diagrams for explaining the method for forming a misalignment testing mark according to the third embodiment.
Figure 19B:
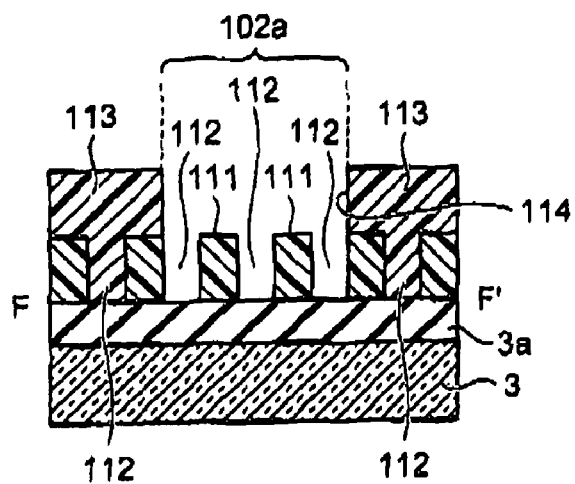

Before a resist as the upper layer of the first layer is applied on the lines and spaces of the lower resist film of the first layer, the lower resist film of the first layer is entirely insolubilized to prevent the lower resist film of the first layer from being dissolved by a resist solvent. An upper resist pattern 113 of the first layer having a predetermined opening 114 that covets the spaces 112 in lines on opposite ends as shown in FIGS. 19A and 19B is formed on the line-and-space pattern of the first layer thus formed, like in the case of the pattern of the contact holes in the first embodiment. Accordingly, a periodical pattern of the spaces 112 is exposed with the spaces 112 in the lines on the opposite ends being covered by the upper resist pattern 113. FIG. 19A is a plan view of the pattern after the upper resist pattern 113 of the first layer is formed. FIG. 19B is a cross-sectional view taken along the line F-F' in FIG. 19A. At this time, a line-and-space pattern extending in a direction perpendicular to the extending direction of the lower resist pattern can be formed on the device area as the upper resist pattern 113. It is unnecessary to cover all of the spaces 112 in the lines on the opposite ends by the upper resist pattern 113, and the periodical pattern can be exposed to cover the lines (patterns) 111 on the opposite ends.

When the upper resist pattern 113 of the first layer is thus formed, the periodical pattern of the spaces 112 formed on the lower resist of the first layer and exposed through the opening 114 can be made as a rectangular mark seen in a broad perspective as shown in FIG. 19A. This mark can be used for the misalignment testing mark 102a. The misalignment testing mark 102c is formed in the same manner as the misalignment testing mark 102a.

Figure 20A:
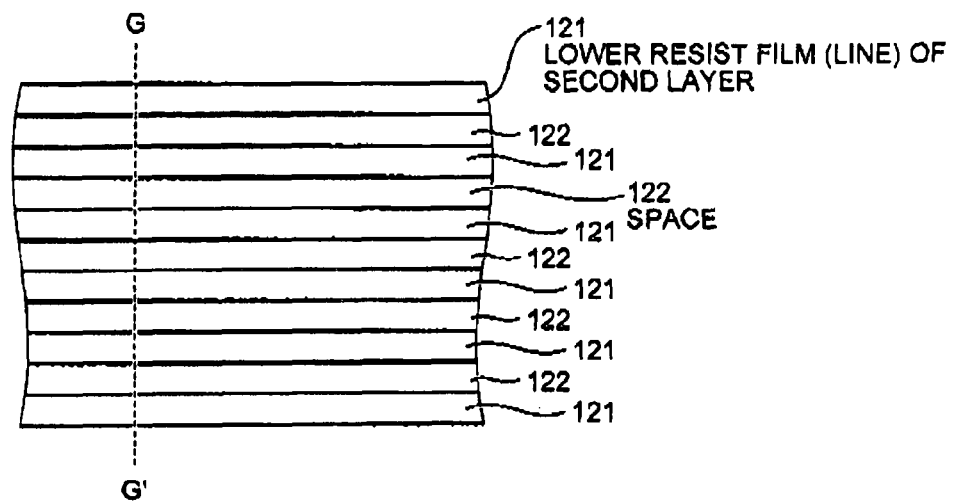
FIGS. 20A and 20B are schematic diagrams for explaining the method for forming a misalignment testing mark according to the third embodiment.
Figure 20B:
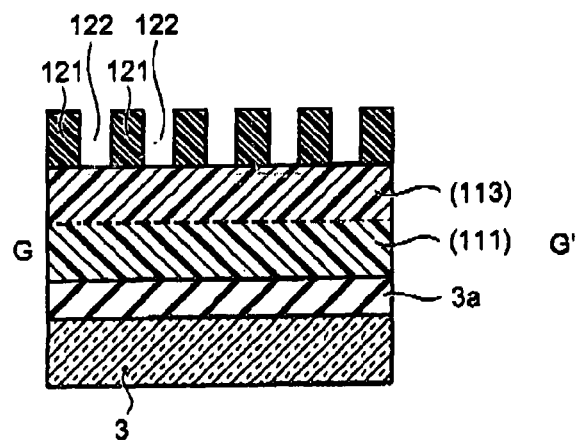

The upper resist pattern 113 of the first layer is then insolubilized. A lower resist film constituting the lower layer of the resist pattern of the second layer is applied entirely on the upper resist pattern of the first layer (on the column resist line pattern 81 and the upper resist pattern 113 of the first layer). A 1:1 line-and-space pattern is transferred on the lower resist film of the second layer by the photolithography technique. The development is then performed to form spaces 122 as shown in FIGS. 20A and 20B. In this way, lines and spaces of a lower resist film (line) 121 and the space 122 of the second layer are formed. FIG. 20A is a plan view of the line-and-space pattern after the lower resist film (line) 121 and the space 122 of the second layer are formed. FIG. 20B is a cross-sectional view taken along the line G-G' in FIG. 20A.

Figure 21A:
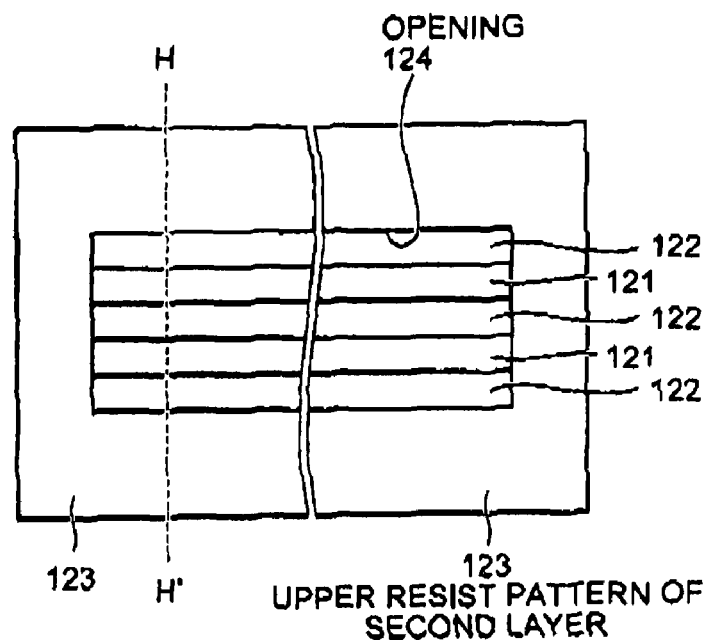
FIGS. 21A and 21B are schematic diagrams for explaining the method for forming a misalignment testing mark according to the third embodiment.
Figure 21B:
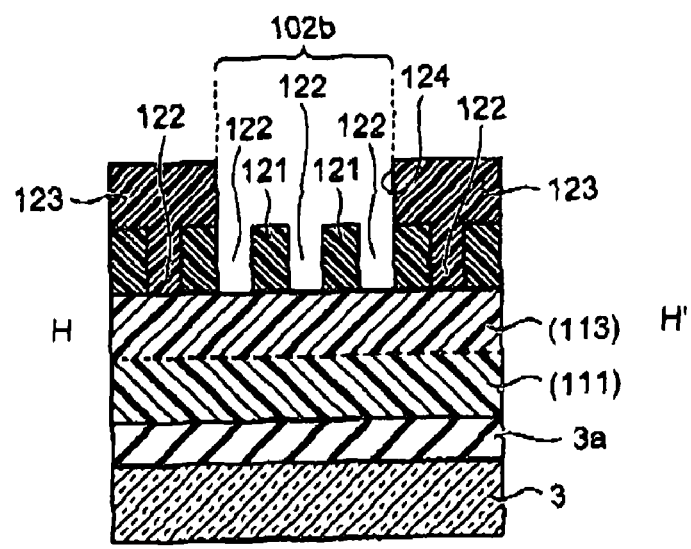

Before a resist as the upper layer of the second layer is applied on the lines and spaces of the lower resist film of the second layer, the lower resist film of the second layer is entirely insolubilized to prevent the lower resist film of the second layer from being dissolved by a resist solvent. For the line-and-space pattern of the second layer thus formed, an upper resist pattern 123 of the second layer having a predetermined opening 124 that covers the spaces 122 in lines on opposite ends is formed as shown in FIGS. 21A and 21B, like in the case of the pattern of the contact holes in the first embodiment. Accordingly, a periodical pattern of the spaces 122 is exposed with the spaces 122 in the lines on the opposite ends being covered by the upper resist pattern 123. FIG. 21A is a plan view of the pattern after the upper resist pattern 123 of the second layer is formed. FIG. 21B is a cross-sectional view taken along the line H-H' in FIG. 21A.

When the upper resist pattern 123 of the second layer is thus formed, the periodical pattern of the spaces 122 formed on the lower resist of the second layer and exposed through the opening 124 can be made as a rectangular mark seen in a broad perspective, as shown in FIG. 21A. This mark can be used for the misalignment testing mark 102b. The misalignment testing mark 102d is formed in the same manner as the misalignment testing mark 102b.

With the mark forming method according to the third embodiment, the area occupancy in the wafer of the misalignment testing marks can be reduced, and thus reduction in the number of products obtained from a wafer can be suppressed. The measurement is performed by using the misalignment testing mark 102 (102a, 102b, 102c, and 102d) formed as described above and the reference position marks 101a, 101b, 101c, and 101d only in a direction in which highly-accurate alignment accuracy measurement is required in the first and second layers. Accordingly, the highly-accurate alignment accuracy measurement in the directions in which highly-accurate measurement needs to be performed for both of the first and second layers that require high alignment accuracy can be achieved by a single measurement in the resist crosspoint exposure. Therefore, highly-accurate alignment measurement with respect to the reference layer in the directions of the respective short sides of the resist lines of the first and second layers can be performed in a short time.

A method for manufacturing a semiconductor device according to the third embodiment uses the mark forming method according to the third embodiment. Therefore, high-accuracy measurement can be achieved in the alignment error measurement, and thus a high-quality semiconductor device with high positional accuracy can be manufactured.

Fourth Embodiment

In a fourth embodiment of the present invention, a technique that enables to perform highly-accurate alignment measurement for a lower layer in a short time when the alignment accuracy measurement is performed in both of column and row directions for the first and second layers and when the alignment-accuracy measurement for the first and second layers with respect to two underlying mark patterns is performed is explained.

Figure 22A:
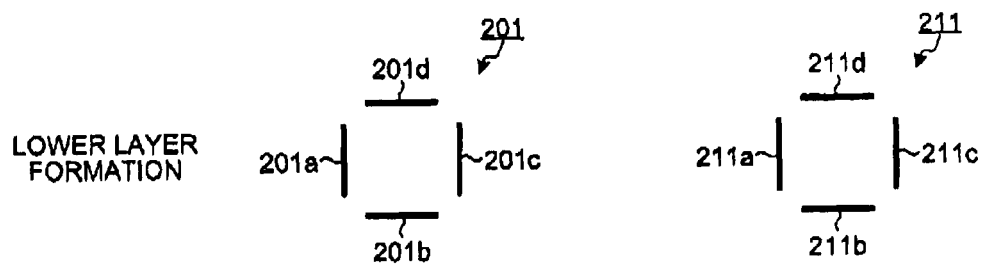
FIGS. 22A to 22C are schematic diagrams for explaining a method for forming a misalignment testing mark according to a fourth embodiment of the present invention.

In the resist crosspoint exposure, which is the method that enables to form the column resist line pattern 81 and the row resist line pattern 82 combined on the same layer, reference position marks 201 and 211 for evaluating alignment accuracy are first formed on the reference layer as shown in FIG. 22A. The reference position mark 201 includes reference position marks 201a, 201b, 201c, and 201d arranged to form four sides of a square on the reference layer. The reference position mark 211 includes reference position marks 211a, 211b, 211c, and 211d arranged to form four sides of a square on the reference layer.

The longitudinal direction of the reference-position marks 201a and 201c and the reference position marks 211a and 211c is parallel to the column resist line pattern 81 (X direction). The longitudinal direction of the reference position marks 201b and 201d and the reference position marks 211b and 211d is parallel to the row resist line pattern 82 (Y direction).

Figure 22B:
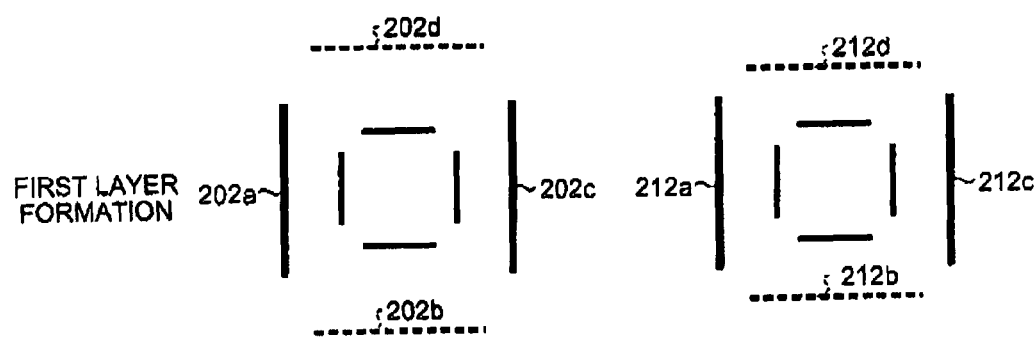

To form small contact holes, the column resist line pattern 81 is formed on the reference layer using the resist pattern of the first layer in the resist crosspoint exposure. At this time, a mask is manufactured so that column marks as bars for alignment accuracy marks are formed in a direction parallel to the reference position marks 201a, 201c, 211a, and 211c (parallel to the column resist line pattern 81), and at positions near and sandwiching the reference position marks 201a and 201c and at positions near and sandwiching the reference position marks 211a and 211c as shown in FIG. 22B. The lithography processing such as resist application, exposure, and development is then performed. The exposure is performed at this time in such a manner that the direction of the long side of the column resist line pattern 81 becomes a direction in which the resolution of the exposure apparatus is enhanced.

In this way, misalignment testing marks 202a and 202c are formed near the reference position marks 201a and 201c as shown in FIG. 22B, using the same resist pattern of the first layer as used for the column resist line pattern 81. Misalignment testing marks 212a and 212c are also formed near the reference position marks 211a and 211c.

When the above mask is manufactured, another mask is manufactured so that column marks as bars for alignment accuracy marks are formed in a direction parallel to the reference position marks 201b, 201d, 211b, and 211d (parallel to the row resist line pattern 82), and at positions near and sandwiching the reference position marks 201b and 201d and at positions near and sandwiching the reference position marks 211b and 211d as shown in FIG. 22B.

In this way, misalignment testing marks 202b and 202d are formed near the reference position marks 201b and 201d as shown in FIG. 22B, using the same resist pattern of the first layer as used for the column resist line pattern 81. Accordingly, a misalignment testing mark 202 located to form four sides of a square is formed. Misalignment testing marks 212b and 212d are formed near the reference position marks 211b and 211d to form a misalignment testing mark 212 located to form four sides of a square. The longitudinal direction of the misalignment testing marks 202b, 202d, 212b, and 212d is a direction other than the direction in which the resolution of the exposure apparatus is enhanced, and thus these marks are formed in defective conditions.

Distances between the misalignment testing marks 202b and 202d and the reference position marks 201b and 201d are set longer than distances between the misalignment testing marks 202a and 202c and the reference position marks 201a and 201d.

The resist pattern of the first layer is then insolubilized to prevent the resist pattern of the first layer from being dissolved. The row resist line pattern 82 is formed on the resist pattern of the first layer in a direction at 90 degrees from the column resist line pattern 81 (perpendicular to the column resist line pattern 81 in the plane of the reference layer) by using the resist pattern of the second layer in the resist crosspoint exposure.

Figure 22C:
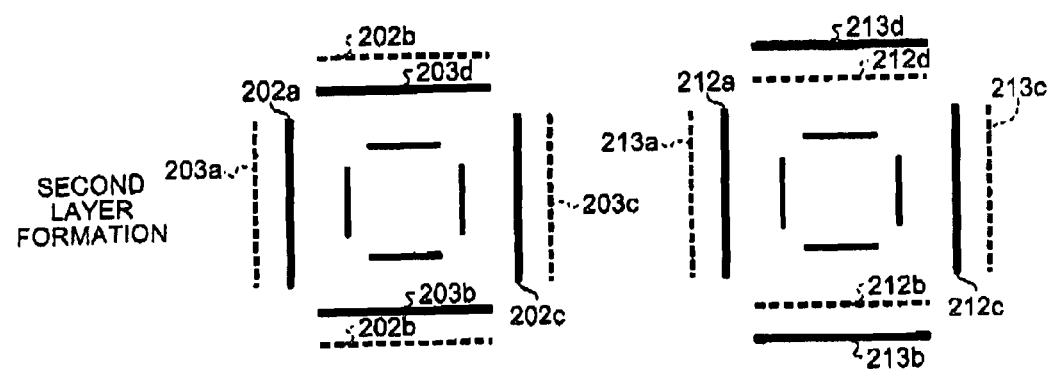

At this time, a mask is manufactured so that marks in the column direction as bars for alignment accuracy marks are formed in a direction parallel to the reference position marks 201b, 201d, 211b, and 211d (parallel to the row resist line pattern 82), and at positions near and sandwiching the reference position marks 201b and 201d and at positions near and sandwiching the reference position marks 211b and 211d as shown in FIG. 22C. The lithography processing such as resist application, exposure, and development is then performed.

In this way, misalignment testing marks 203b and 203d are formed near the reference position marks 201b and 201d as shown in FIG. 22c, by using the same resist pattern of the second layer as used for the row resist line pattern 82. Misalignment testing marks 213b and 213d are also formed near the reference position marks 211b and 211d.

When the above mask is manufactured, another mask is manufactured so that column marks as bars for alignment accuracy marks are formed in a direction parallel to the reference position marks 201a, 201c, 211a, and 211c (parallel to the column resist line pattern 81), and at positions near and sandwiching the reference position marks 201a and 201c and at positions near and sandwiching the reference position marks 211a and 211c as shown in FIG. 22C. The lithography processing such as resist application, exposure, and development is then performed. The exposure at this time is performed in such a manner that the direction of the long side of the row resist line pattern 82 becomes a direction in which the resolution of the exposure apparatus is enhanced.

In this way, misalignment testing marks 203a and 203c are formed near the reference position marks 201a and 201c as shown in FIG. 22C, by using the same resist pattern of the second layer as used for the row resist line pattern 82. Misalignment testing marks 213a and 213c are also formed near the reference position marks 211a and 211c.

The longitudinal direction of the misalignment testing marks 203a, 203c, 213a, and 213c is a direction other than the direction in which the resolution of the exposure apparatus is enhanced, and thus these marks are formed in defective conditions.

Distances between the misalignment testing marks 203a and 203c and the reference position marks 201a and 201c are set longer than distances between the misalignment testing marks 202a and 202c and the reference position marks 201a and 201c. Accordingly, the misalignment testing marks 203a and 203c and the misalignment testing marks 202a and 202c are prevented from overlapping.

Distances between the misalignment testing marks 203b and 203d and the reference position marks 201b and 201d are set shorter than distances between the misalignment testing marks 202b and 202d and the reference position marks 201b and 201d. Accordingly, the misalignment testing marks 203b and 203d and the misalignment testing marks 202b and 202d are prevented from overlapping.

Distances between the misalignment testing marks 213a and 213c and the reference position marks 211a and 211c are set longer than distances between the misalignment testing marks 212a and 212c and the reference position marks 211a and 211c. Accordingly, overlapping of the misalignment testing marks 213a and 213c and the misalignment testing marks 212a and 212c is prevented.

Distances between the misalignment testing marks 213b and 213d and the reference position marks 211b and 211d are set longer than distances between the misalignment testing marks 212b and 212d and the reference position marks 211b and 211d. Accordingly, overlapping of the misalignment testing marks 213b and 213d and the misalignment testing marks 212b and 212d is prevented.

A detailed method for forming the misalignment testing marks 201 and 202 is the same as that in the third embodiment, and thus explanations thereof will be omitted.

When alignment accuracy measurement is performed using the misalignment testing marks 201 and 202 thus formed, only measurement in the directions of short sides of the column resist line pattern 81 and the row resist line pattern 82 is performed in a first measurement. That is, measurement between the misalignment testing marks 202a, 202c, 203b, and 203d, and the reference position mark 201, and measurement between the misalignment testing marks 212a, 212c, 213b, and 213d, and the reference position mark 211 are performed.

In a second measurement, only measurement in the directions of the long sides of the column resist line pattern 81 and the row resist line pattern 82 is performed. That is, measurement between the misalignment testing marks 203a, 203c, 202b, and 202d, and the reference position mark 201, and measurement between the misalignment testing marks 213a, 213c, 212b, and 212d, and the reference position mark 211 are performed.

With the mark forming method according to the fourth embodiment, alignment accuracy measurement in directions requiring high accuracy can be achieved in a single measurement for both of the first and second layers that require high alignment accuracy. Accordingly, the highly-accurate alignment measurement with respect to the reference layer in the directions of the short sides of the respective resist lines of the first and second layers can be achieved in a short time. The alignment accuracy with respect to the reference layer in the directions of the long sides of the respective resist line patterns of the first and second layers, which do not require so high alignment accuracy, can be also measured.

When the alignment accuracy measurement in the directions of the short sides of the respective resist line patterns that require high accuracy for the first and second layers is achieved by a single measurement, no difference in completeness with respect to one reference position mark between the misalignment testing marks (for example, the misalignment testing marks 202a and 202c and the misalignment testing marks 203b and 203d) to be used for the alignment accuracy measurement is produced. Therefore, the measurement recipe for the alignment-accuracy measuring instrument becomes easy to optimize, and thus highly-accurate alignment accuracy measurement can be provided.

A method for manufacturing a semiconductor device according to the fourth embodiment uses the mark forming method according to the fourth embodiment. Therefore, high-accuracy measurement can be achieved in the alignment error measurement, and thus a high-quality semiconductor device with high positional accuracy can be manufactured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mark forming method comprising:
forming a first mask layer on a semiconductor substrate;
forming at least three first patterns having periodicity on the first mask layer;
forming a second mask layer on the first mask layer to cover the at least three first patterns formed thereon; and
forming an opening in the second mask layer to expose at least one of the at least three first patterns while leaving covered at least two patterns on ends of the at least three first patterns, thereby forming a mark composed of the exposed at least one of the first patterns.

2. The method according to claim 1, wherein the first patterns are composed of hole patterns having periodicity.

3. The method according to claim 1, wherein the first patterns are composed of line-and-space patterns having periodicity.

4. The method according to claim 3, wherein the first patterns are composed of a first line-and-space pattern having periodicity and a second line-and-space pattern having periodicity, the first and second line-and-space patterns being perpendicular to each other.

5. The method according to claim 1, wherein the first mask layer has second patterns different from the first patterns and extending in a first direction, the first patterns extend in the first direction, the second mask layer has third patterns extending in a second direction perpendicular to the first direction, and the mark is composed of the first patterns and the third patterns.

6. The method according to claim 1, wherein the second mask layer is formed after the first mask layer having the first patterns formed thereon is insolubilized.

7. The method according to claim 1, wherein the first and second mask layers are composed of photosensitive resin films.

8. The method according to claim 1, wherein the first mask layer is a hard mask layer, and the second mask layer is composed of a photosensitive resin film.

9. The method according to claim 1, wherein the mark is a test mark used for testing misalignment between the semiconductor substrate and plural layers among layers formed on the semiconductor substrate.

10. The method according to claim 9, wherein the mark is a pair of the test marks formed spaced apart.

11. The method according to claim 1, wherein the opening is formed in the second mask layer to leave covered only two patterns on ends of the at least three first patterns.

12. A mark forming method comprising:
forming a first mask layer on a semiconductor substrate;
forming at least three first patterns having periodicity on the first mask layer;
forming a second mask layer on the first mask layer to cover the at least three first patterns formed thereon;
forming an opening in the second mask layer to expose at least one of the at least three first patterns while leaving covered at least two patterns on ends of the at least three first patterns, thereby forming second patterns composed of the exposed at least one of the first patterns; and
processing a lower layer below the first mask layer using the second patterns to form a mark on the lower layer.

13. The method according to claim 12, wherein the first mask layer has patterns different from the first patterns and extending in a first direction, the first patterns extend in the first direction, the second mask layer has third patterns extending in a second direction perpendicular to the first direction, and the second patterns are composed of the first patterns and the third patterns.

14. A method for manufacturing a semiconductor device comprising:
forming a first mask layer on a semiconductor substrate;
forming at least three first patterns having periodicity on the first mask layer;
forming a second mask layer on the first mask layer to cover the at least three first patterns formed thereon;
forming an opening in the second mask layer to expose at least one of the at least three first patterns while leaving covered at least two patterns on ends of the at least three first patterns, thereby forming a mark composed of the exposed at least one of the first patterns; and
manufacturing a semiconductor device by using the mark as a misalignment testing mark or an alignment mark at exposure.

15. The method according to claim 14, wherein the first patterns are composed of hole patterns having periodicity.

16. The method according to claim 14, wherein the first patterns are composed of line-and-space patterns having periodicity.

17. The method according to claim 14, wherein the first patterns are composed of a first line-and-space pattern having periodicity and a second line-and-space pattern having periodicity, the first and second line-and-space patterns being perpendicular to each other.

* * * * *